(12) United States Patent
Cheng et al.

(10) Patent No.: US 10,503,953 B2
(45) Date of Patent: Dec. 10, 2019

(54) DISPLAY DEVICE HAVING A LIGHT SENSING UNIT

(71) Applicant: Innolux Corporation, Miao-Li County (TW)

(72) Inventors: Chang-Chiang Cheng, Miao-Li County (TW); Chih-Hao Chang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 58 days.

(21) Appl. No.: 15/823,789

(22) Filed: Nov. 28, 2017

(65) Prior Publication Data

US 2018/0165496 A1 Jun. 14, 2018

(30) Foreign Application Priority Data

Dec. 8, 2016 (CN) .......................... 2016 1 1122820

(51) Int. Cl.
*G06K 9/28* (2006.01)
*G06K 9/00* (2006.01)
(52) U.S. Cl.
CPC ....... *G06K 9/0004* (2013.01); *G06K 9/00053* (2013.01); *G06K 2009/0006* (2013.01); *G06K 2209/03* (2013.01)

(58) Field of Classification Search
CPC ......... G06K 9/0004; G02F 1/133–2001/13685
See application file for complete search history.

(56) References Cited

U.S. PATENT DOCUMENTS

2006/0017862 A1* 1/2006 Song ................... G02F 1/13338 349/42
2018/0052359 A1* 2/2018 Umemoto ............. G02F 1/1333
2018/0307887 A1* 10/2018 Han ..................... G06K 9/0004

FOREIGN PATENT DOCUMENTS

CN 1689025 A 10/2005
WO 2004036484 A1 4/2004

OTHER PUBLICATIONS

CN Office Action issued on Jul. 29, 2019, Chinese Application No. 201611122820.3, pps. 1-8.

* cited by examiner

*Primary Examiner* — Brian Werner
(74) *Attorney, Agent, or Firm* — McClure, Qualey & Rodack, LLP

(57) ABSTRACT

A display device is described. The display device includes a first substrate, a second substrate, and a display layer disposed between the first substrate and the second substrate. The first substrate includes a pixel driving unit. The second substrate includes the light sensing unit.

19 Claims, 10 Drawing Sheets

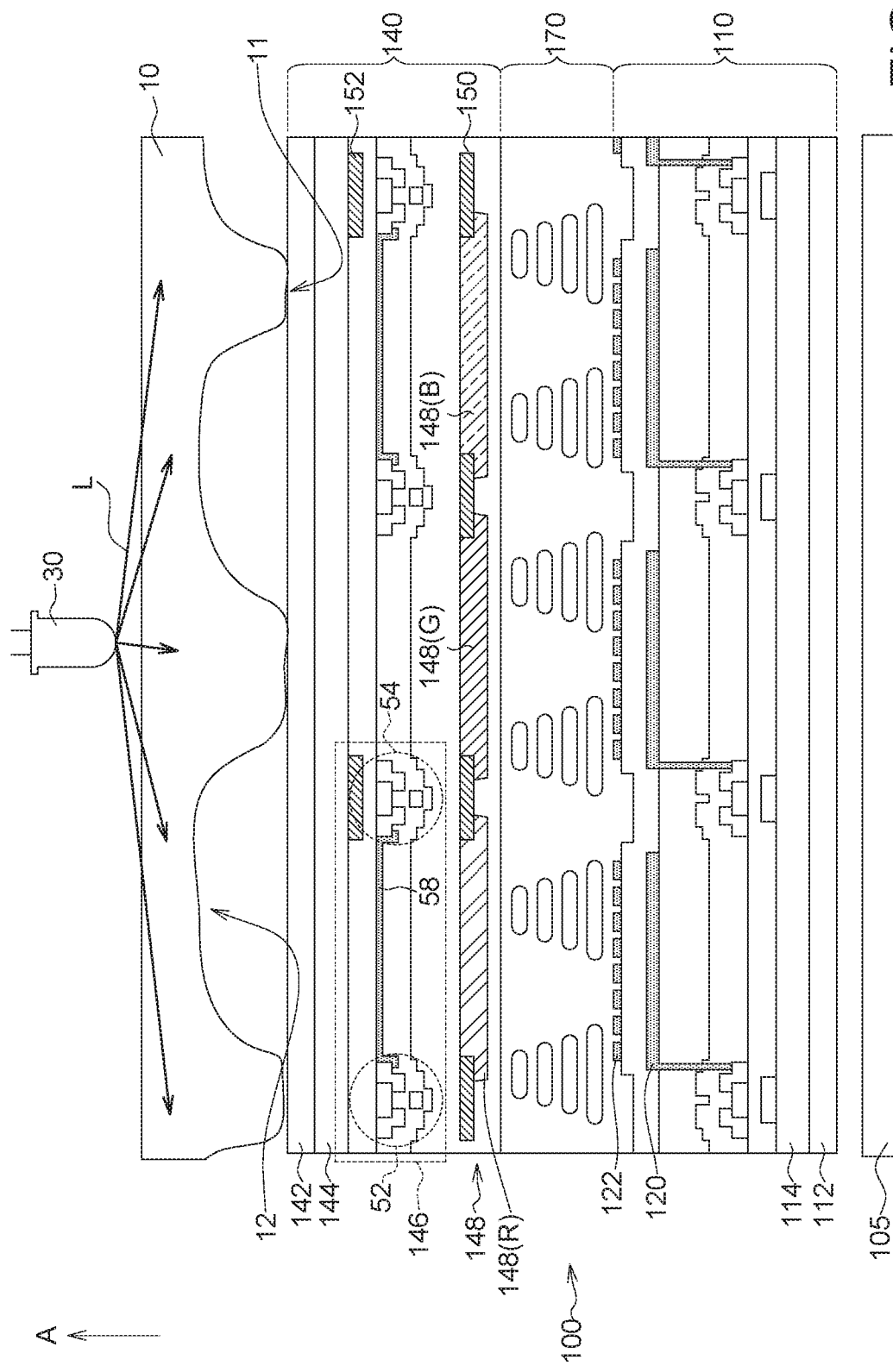

DISPLAY DEVICE HAVING A LIGHT SENSING UNIT

This application claims the benefit of People's Republic of China application Serial No. 201611122820.3, filed on Dec. 8, 2016, the subject matter of which is incorporated herein by reference.

TECHNICAL FIELD

The disclosure relates to a display device. The disclosure particularly relates to a display device comprising a light sensing unit.

BACKGROUND

Considering safety, convenience, or recognition efficiency, biological recognition becomes the main way. Biological recognition can be achieved by using sensing devices. The sensing devices include capacitive type, thermal type, optical type, or the like. No matter what kind thereof, the biological sensing devices are typically fabricated on silicon chips.

Recently, the concept of biological recognition is further applied into portable electronic products, such as smart phones. For the smart phones in the market today, the biological (such as fingerprints, palm, or face) recognition means that is mainly used in the smart phones of various companies is capacitor fingerprint sensing device. Since the capacitor biological sensing device is needed to be fabricated on silicon chips, a space must be reserved on the surfaces of a smart phone for arranging the sensing area for biological recognition. It influences the aesthetic experience or usage convenience. In addition, the process for forming the open space must be added into the manufacturing processes. The manufacturing cost and/or process complexity may be increased. Further, the cost of using the silicon chips is rather high.

As such, research and improvement of fingerprint sensing means, particularly of the biological sensing means applicable in portable electronic products, have continued.

SUMMARY

According to some embodiments, a display device is provided. The display device comprises a first substrate, a second substrate, and a display layer disposed between the first substrate and the second substrate. The first substrate comprises a pixel driving unit. The second substrate comprises a light sensing unit.

BRIEF DESCRIPTION OF THE DRAWINGS

FIG. 9 shows a display device according to one embodiment.

Figure 1A:
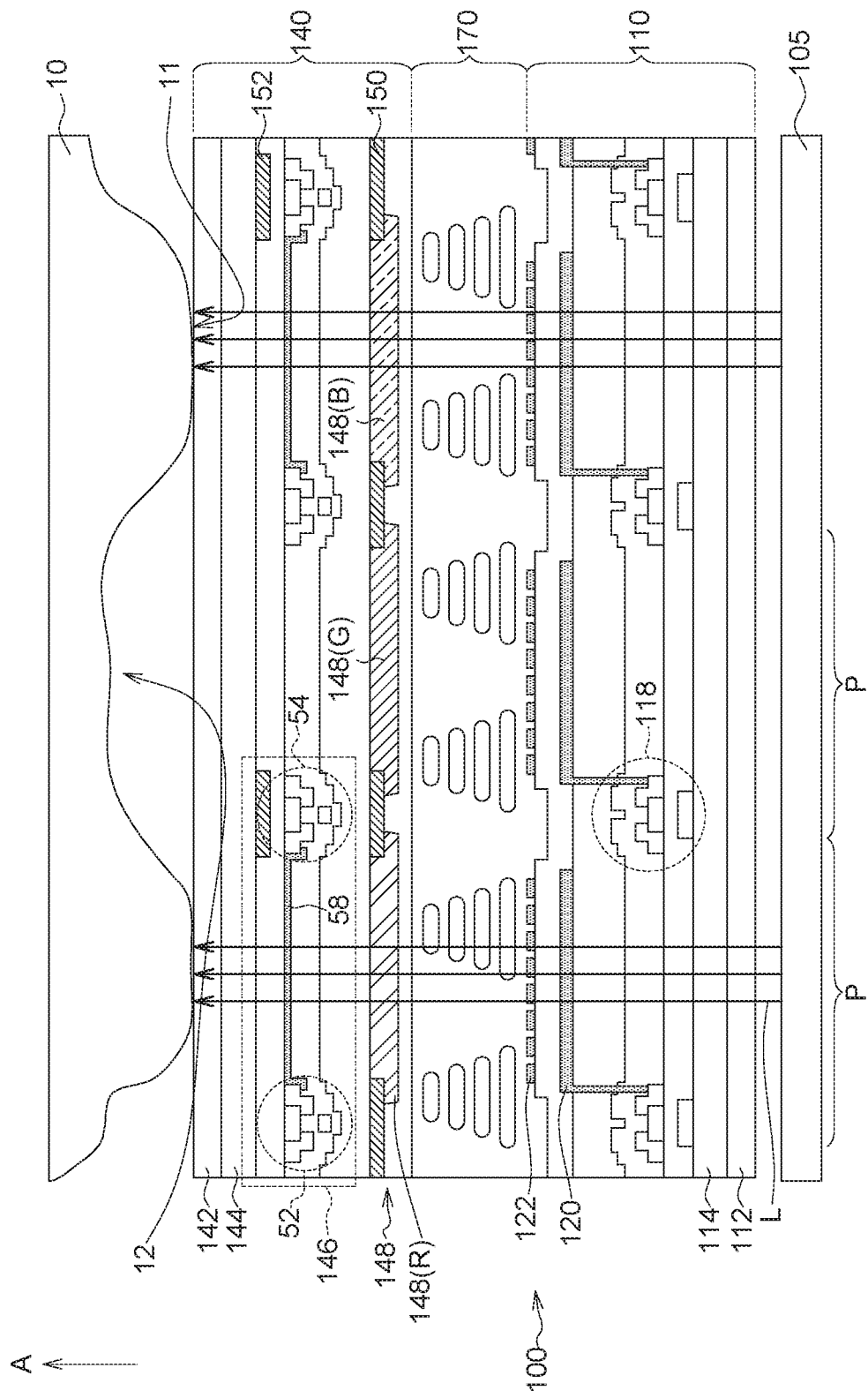
FIG. 1A shows a display device according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

The disclosure provides a display device. According to some embodiments, the display device may comprise a first substrate, a second substrate, and a display layer, wherein the first substrate is a substrate comprising a pixel driving unit, the second substrate is a substrate comprising a light sensing unit, and the display layer is disposed between the first substrate and the second substrate. The display device having such structure will be described more fully hereinafter with reference to accompanying drawings. It is noted that how the elements are shown in the drawings should not limit the scope of the disclosure. A person skilled in the art can use alternatives that are known in the related fields. For example, the sequence of some elements may be changed, some elements may be omitted or be replaced by some other elements, and/or some elements may be added. For focusing on the disclosure, some alternative implementations may be omitted in the description, and, in some conditions, even the description to some elements in the drawings may be omitted. However, a person skilled in the art can still realize the disclosure and modify the details of the implementations within the scope of the present disclosure. Further, the features, advantages, and the like that are provided in one embodiment may be incorporated into or combined with another embodiment without additional recitation, while it is possible.

Referring to FIG. 1A, a display device 100 having a light sensing unit is shown. The display device 100 comprises a first substrate 110, a second substrate 140, and a display layer 170 disposed there between. The display layer 170 may comprise a liquid crystal layer, organic light emitting diode (OLED) elements, micro light emitting diode (µLED) elements, mini light emitting diode (mini LED) elements, combinations of the above, or other suitable materials, but the disclosure is not limited thereto.

The display device 100 shown in FIG. 1A is a liquid crystal display (LCD) device, wherein the display layer 170 is a liquid crystal layer. The first substrate 110 may comprise a polarizer 112, a first base 114, a pixel driving unit 118, and a first electrode 120. For example, these elements may be sequentially disposed. More specifically, the pixel driving unit 118 may be disposed on the first base 114, and the first electrode 120 may be disposed on the pixel driving unit 118. The first base 114 may be formed of a transparent material, such as glass or other suitable transparent material. The display device 100 may comprise a plurality of the pixel driving units 118, which are arranged in a matrix. For ease of illustration, only four of the pixel driving units 118 are shown in FIG. 1A. For example, the pixel driving unit 118 may be a top gate transistor or a bottom gate transistor, but the disclosure is not limited thereto. The pixel driving unit 118 comprises an active layer, which may be formed of amorphous silicon (a-Si), low temperature poly-silicon (LTPS), indium gallium zinc oxide (IGZO), or combination thereof, but the disclosure is not limited thereto.

The first electrode 120 may be electrically connected with the pixel driving unit 118. According to some embodiments, the first electrode 120 may be a pixel electrode. The first substrate 110 may further comprise a second electrode 122, such as a common electrode. The second electrode 122 may be formed of non-metallic materials having electrical conductivity, such as indium tin oxide (ITO), or indium gallium zinc oxide (IGZO), but the disclosure is not limited thereto. As such, the display device 100 may be constituted as a fringe field switching (FFS) liquid crystal display device. However, the disclosure is not limited thereto. The display device 100 may be other type of liquid crystal display device, such as an in-plane switching (IPS) liquid crystal display device, a vertical alignment (VA) liquid crystal display device, a twisted nematic (TN) liquid crystal, or other liquid crystal display device, but the disclosure is not limited thereto.

The second substrate 140 comprises a light sensing unit 146. The second substrate 140 is toward displaying side or biological recognition side. The second substrate 140 may comprise a polarizer 142, a second base 144, the light sensing unit 146, and a color filter layer 148. For example, these elements may be sequentially disposed. The polarizer 142 and the polarizer 112 may be arranged in a way that polarization directions of the polarizer 142 and the polarizer 112 may be different. The second base 144 may comprise a transparent material, such as glass or other suitable material. The light sensing unit 146 may be used for biological recognition (such as fingerprints, palm, or face). For example, FIG. 1 shows that the sensing unit 146 may be used for fingerprints recognition. The light sensing unit 146 is used for receiving the light from the finger 10 of the user, and outputting a fingerprint sensing signal correspondingly. More specifically, a light reflected by a ridge 11 of the finger 10 will be stronger, and/or a light reflected by a valley 12 will be weaker. The light sensing unit 146 output different fingerprint sensing signals for the lights of different strengths, and thereby fingerprint recognition can be conducted. The details of the light sensing unit 146 will be illustrated with reference to FIG. 2A to FIG. 3B.

Figure 2A:
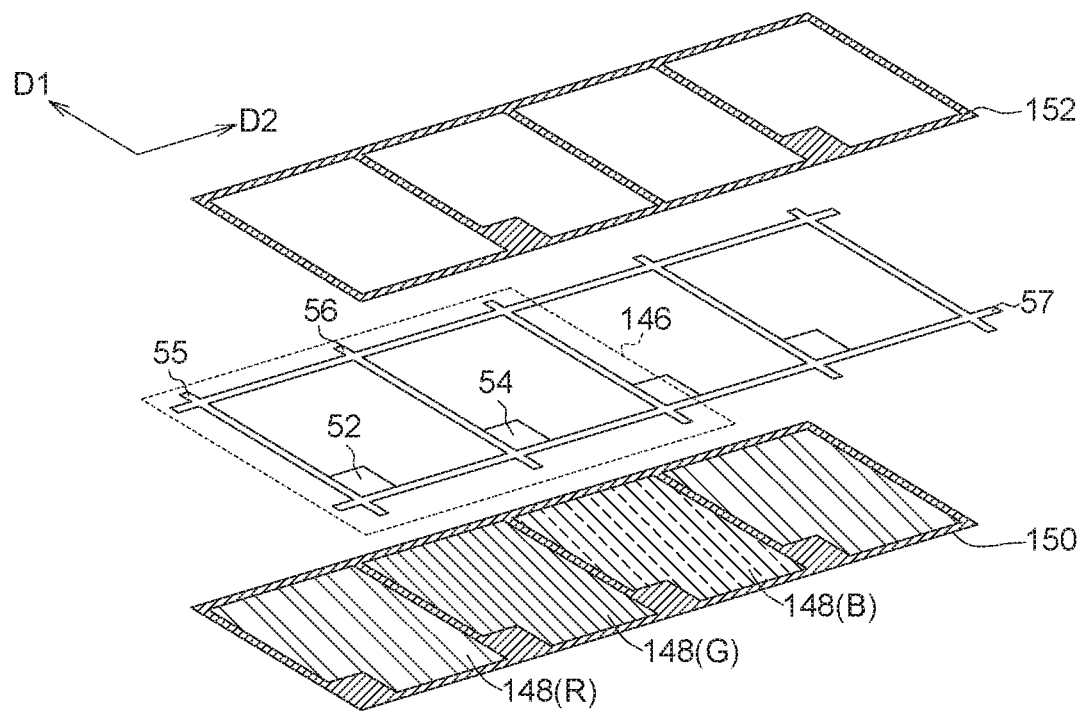
FIGS. 2A-2C shows the arrangement of a light sensing unit and the related elements according to one embodiment.

The color filter layer 148 is disposed between the light sensing unit 146 and the display layer 170. Referring to FIG. 1A and FIG. 2A, the color filter layer 148 comprises color resists of at least two colors. The second substrate 140 further comprises a black matrix 150, the black matrix 150 is disposed on the second base 144, and the black matrix 150 is disposed between color resists of different colors. In some embodiments, the color filter layer comprises a first color portion and a second color portion, a color of the first color portion is different from a color of the second color portion, and the black matrix is disposed between the first color portion and the second color portion. In other words, for example, the color filter layer 148 may comprise red color resists 148(R), green color resists 148(G), blue color resists 148(B). The black matrix 150 may define a plurality of sub-pixels P. The black matrix 150 is disposed between the color resists of different colors to separate the plurality of color resists of different colors. The position of each color resist may correspond to the position of each sub-pixel P. The black matrix 150 may overlap the pixel driving unit in a normal direction A, which is perpendicular to the first base 114. In other words, the black matrix 150 may be arranged in a way that it correspondingly shields the pixel driving units 118 of the first substrate 110, while it is not necessary. The black matrix 150 may comprise black photoresist, ink, or other light absorption materials, but the disclosure is not limited thereto.

Figure 2B:
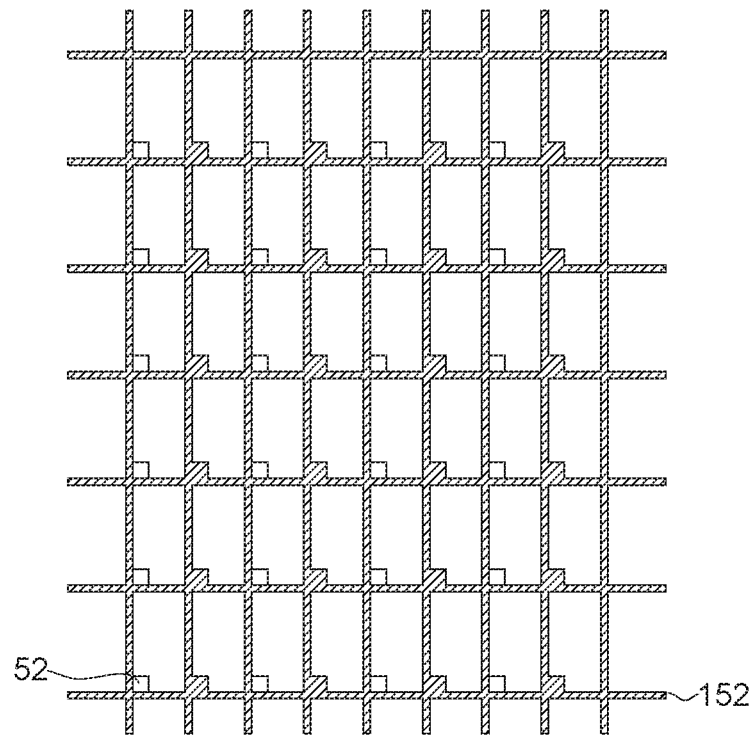
Figure 2C:
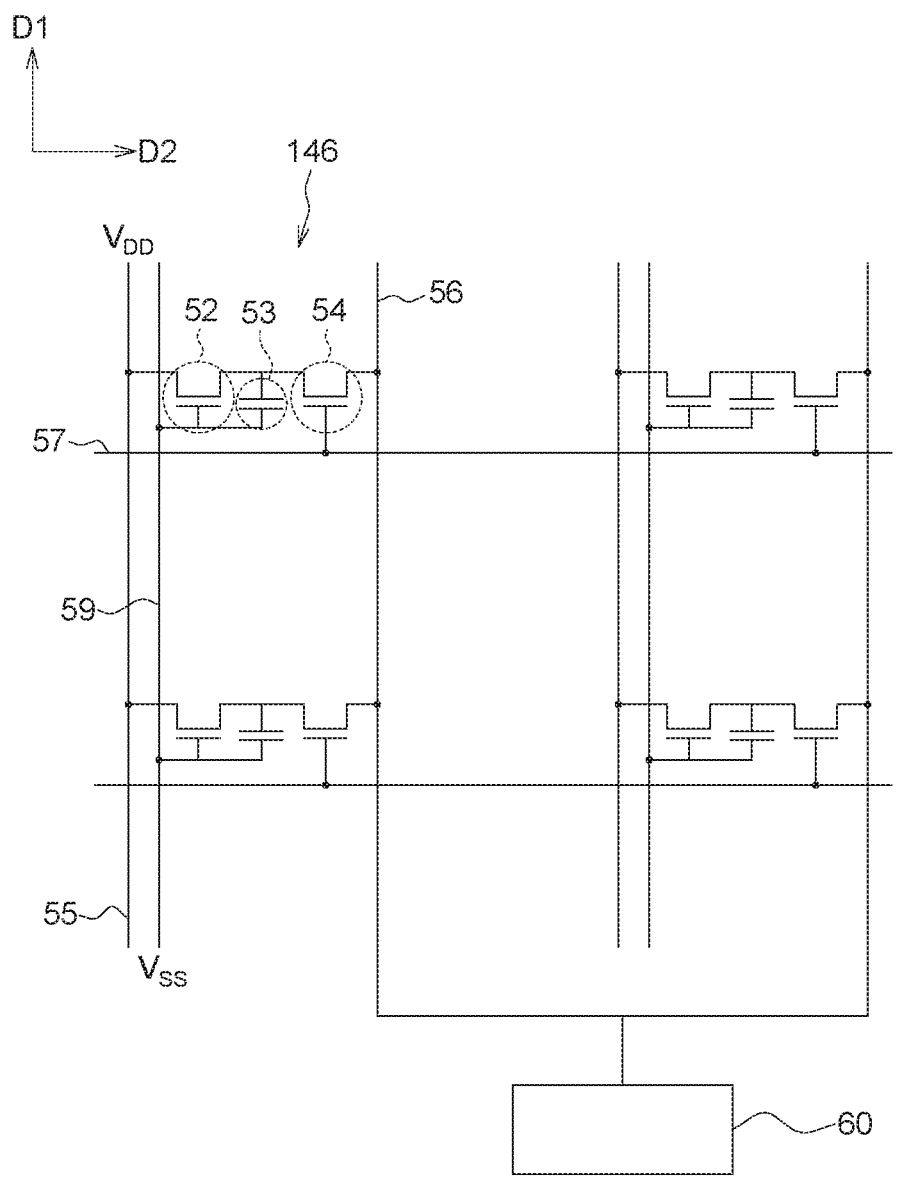

Referring to FIGS. 2A-2C, the arrangement of the light sensing unit and the related elements according to one embodiment is shown. Here, the related elements will be described by taking the elements in the display device 100 as an example. In this embodiment, the light sensing unit 146 may comprise a sensing transistor 52 and a switching element 54, which are electrically connected with each other. The sensing transistor 52 is used for receiving the light from the finger 10 of the user, and output an electrical signal correspondingly. The light comprises visible light, but not limited thereto. For example, the light may be near ultra-violet light that has a higher energy and can produce a greater signal change. The switching element 54 may be a switching transistor, and the switching transistor is used for controlling the output of the fingerprint sensing signal that is based on the electrical signal.

The sensing transistor 52 comprises an active layer, which may be formed of amorphous silicon, low temperature poly-silicon, IGZO, or the like. In this embodiment, the electrical signal may be an off-current signal. For example, the sensing transistor 52 may have the active layer formed by an amorphous silicon layer. The amorphous silicon material can produce a leakage phenomenon caused by the illumination of a light. As such, the active layer formed of amorphous silicon leads to an obvious off-current variation of the sensing transistor 52 caused by the various strengths of the received light. The charges produced by the off-current may accumulate in the capacitor 53 coupled between the sensing transistor 52 and the switching element 54. When a particular light sensing unit 146 is scanned, its switching element 54 is turned on, and a processing unit 60 can recognize the detected signal corresponding to a ridge 11 or a valley 12 of the finger 10 according to the current intensity.

According to some embodiments, as shown in FIG. 1A, the sensing transistor 52 and the pixel driving unit 118 may overlap in the normal direction A. In some embodiments, the sensing transistor 52 and the pixel driving unit 118 may at least partially overlap in the normal direction A. As such, the influence of the sensing transistor 52 on the resolution and the aperture ratio of the display device 100 can be reduced. For example, the sensing transistor 52 and the pixel driving unit 118 may completely overlap in the normal direction A. According to some embodiments, the switching element 54 and the pixel driving unit 118 may overlap in the normal direction A. In some embodiments, the switching element 54 and the pixel driving unit 118 may at least partially overlap. As such, the influence of the switching element 54 on the resolution and the aperture ratio of the display device 100 can be reduced. For example, the switching element 54 and the pixel driving unit 118 may completely overlap in the normal direction A, but the disclosure is not limited thereto.

Figure 3A:
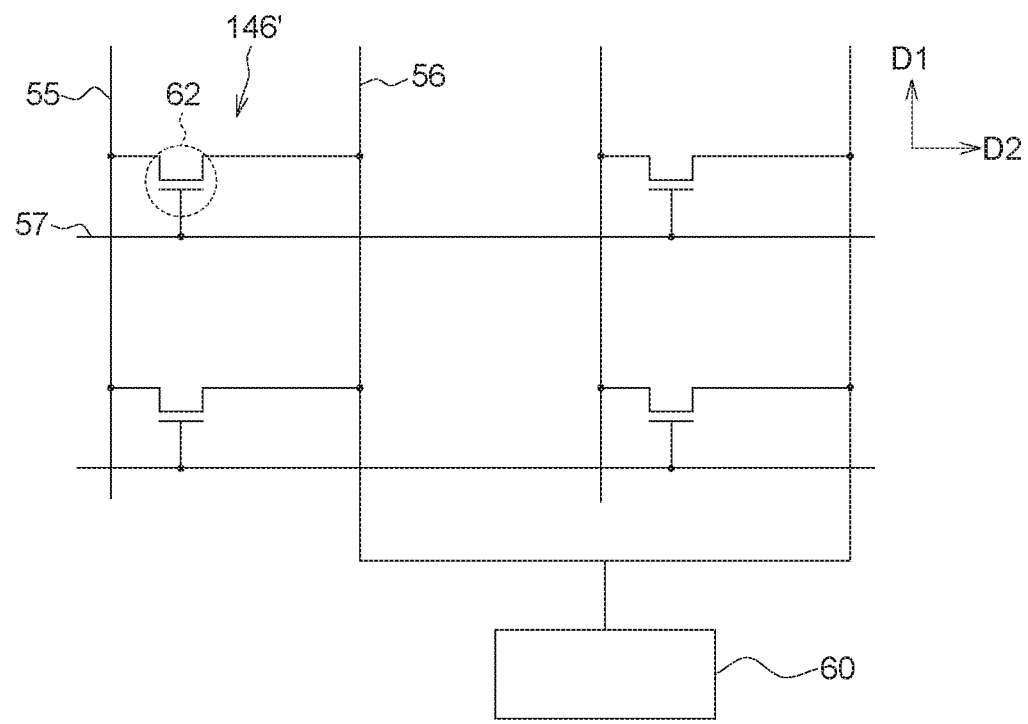
FIG. 3A shows the arrangement of a light sensing unit and the related elements according to one embodiment.

According to some embodiments, the second substrate 140 may comprise a conductive line coupling the light sensing unit 146 with the processing unit 60 (as shown in FIG. 3A). More specifically, as shown in FIG. 2A and FIG. 2C, the second substrate 140 may comprise a first conductive line 55 and a second conductive line 56 extending along a first direction D1 as well as a third conductive line 57 extending along a second direction D2, wherein the second direction D2 is different from the first direction D1. In some embodiments, the first direction D1 and the second direction D2 may be perpendicular to each other, but the disclosure is not limited thereto. In some embodiments, the first direction D1 may be parallel with the data line, the second direction D2 may be parallel with the scan line, but the disclosure is not limited thereto. The first conductive line 55, the second conductive line 56, and the third conductive line 57 may be connected with the light sensing unit 146. For example, the first conductive line 55 may be a data line for the light sensing unit 146, the first conductive line 55 may transmit a supply voltage $V_{DD}$ to the light sensing unit 146. For example, the second conductive line 56 may be a signal line for the light sensing unit 146, which may be electrically connected to the processing unit 60. For example, the third conductive line 57 may be a scan line for the light sensing unit 146, the third conductive line 57 may transmit a scan voltage signal to the light sensing unit 146. The second substrate 140 may further comprise a fourth conductive line 59 disposed along the first direction D1, the fourth conductive line 59 is connected to the gate of the sensing transistor 52, and may be a gate line for the sensing transistor 52. For example, the fourth conductive line 59 may transmit a reference voltage signal $V_{SS}$ to light sensing unit 146. The first conductive line 55, the second conductive line 56, the third conductive line 57, and the fourth conductive line 59 may comprise a transparent electrode layer 58 (shown in FIG. 1A) or a metal layer, but not limited thereto. The transparent electrode layer 58 includes ITO, or other suitable conductive materials. The metal layer includes copper (Cu), aluminum (Al), molybdenum (Mo), chromium (Cr), or other suitable conductive materials. For example, the processing unit 60 may be an IC chip, which is used for signal recognition.

In this embodiment, the second substrate 140 further comprises a light shielding layer 152, and the light shielding layer 152 is disposed between the second base 144 and the switching element 54. According to some embodiments, the light shielding layer 152 and the switching element 54 may overlap in the normal direction A. In some embodiments, the light shielding layer 152 and the switching element 54 may at least partially overlap in the normal direction A. According to some embodiments, the light shielding layer 152 may completely cover the switching element 54 in the normal direction A. According to some embodiments, the light shielding layer 152 and the sensing transistor 52 may not overlap in the normal direction. The light shielding layer 152 and the sensing transistor 52 may be separated in the normal direction A. In other words, the light shielding layer 152 does not cover the sensing transistor 52, and the sensing transistor 52 is exposed by the light shielding layer 152, as shown in FIG. 2B. For example, the light shielding layer 152 may be arranged in a way that it corresponds to and covers the switching element 54, but may not cover the sensing transistor 52. The light shielding layer 152 overlaps the pixel driving units 118 in the normal direction A. According to some embodiments, the position of each light sensing unit 146 may correspond to the position of two sub-pixels P, as shown in FIG. 2A. Such arrangement is advantageous for the overlapping of the light shielding layer 152 and the black matrix 150 without an influence on the aperture ratio of the display device 100. However, according to other embodiments, the light sensing unit 146 may correspond to the position of one or more sub-pixels P. This can be decided according to the needed resolution of the light sensing unit without particular restriction.

Figure 1B:
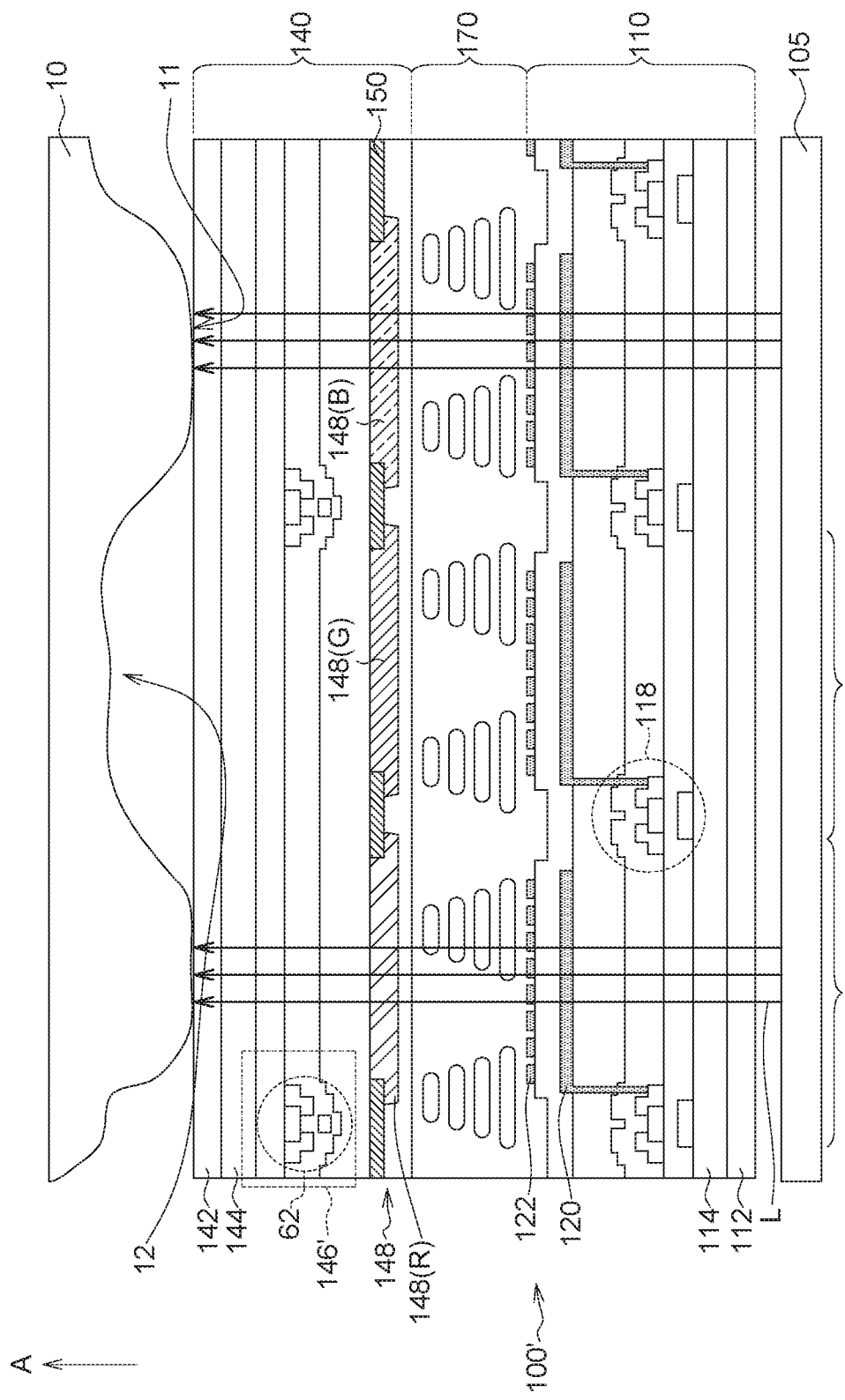
FIG. 1B shows a display device according to one embodiment.

Referring to FIG. 1B, a display device 100' according to another embodiment is shown. The display device 100' is similar to the display device 100, but has a different light sensing unit 146'. Referring to FIG. 3A, the arrangement of the light sensing unit 146' and the related elements according to this embodiment is shown. The arrangement of the related elements is similar to that shown in FIGS. 2A-2C, except for the parts specifically pointed out below. In this embodiment, the light sensing unit 146' comprises a sensing transistor 62, but does not comprise any switching element. The sensing transistor 62 is used for receiving the light from the finger 10 of the user, and/or outputting an electrical signal as the fingerprint sensing signal. In this embodiment, the electrical signal may be an on-current signal. For example, the leakage of the active layer of the sensing transistor 62 caused by the illumination leads to an increase of the on-current of the sensing transistor 62, and the processing unit 60 conducts fingerprint recognition accordingly. In this embodiment, since the light sensing unit 146' does not comprise any switching element, the light shielding layer 152 may not be formed on the second substrate 140. In this embodiment, the position of each light sensing unit 146' may correspond to the position of two sub-pixels P.

Figure 3B:
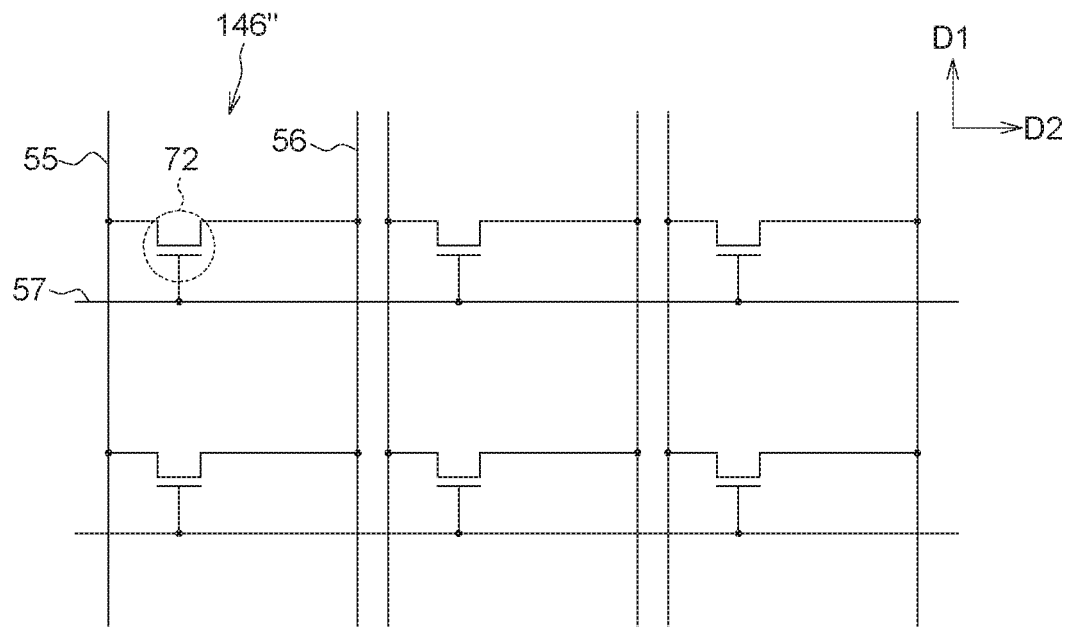
FIG. 3B shows the arrangement of a light sensing unit and the related elements according to one embodiment.

FIG. 3B shows the arrangement of the light sensing unit and the related elements according to another embodiment. Similar to the embodiment of FIG. 3A, in this embodiment, the light sensing unit 146" comprises a sensing transistor 72, but does not comprise any switching element. In this embodiment, the position of each light sensing unit 146" may correspond to the position of one sub-pixel.

Referring back to FIG. 1A, the display device 100 further comprises a backlight source 105. The first substrate 110 is disposed between the backlight source 105 and the second substrate 140. In other word, the backlight source 105 is disposed at the side of the first substrate 110 opposite to or away from the second substrate 140. In some embodiments, in the fingerprint recognition mode of the display device 100, the light emitted from the backlight source 105 may be reflected by the finger 10 of the user, and the light sensing unit 146 receives this reflected light and output a fingerprint sensing signal correspondingly. According to some embodiments, as shown in FIG. 1A, the sensing transistor 52 and the switching element 54 of the light sensing unit 146 are disposed in a way that they are aligned with the pixel driving unit 118 of the first substrate 110. As such, the influence on the aperture ratio of the display device 100 can be avoided. Alternatively, the display device 100 has a light sensing unit 146' as shown in FIG. 3A or a light sensing unit 146" as shown in FIG. 3B, and the sensing transistor 62/72 is disposed in a way that it is aligned with the pixel driving unit 118 of the first substrate 110 to avoid the influence on the aperture ratio of the display device 100.

According to some embodiments, the light sensing unit 146 is fabricated or deposed on the second substrate 140, and the light sensing unit 146 is toward the displaying side of the display device. The light reflected by the finger 10 can arrive the sensing transistor with a relative short path length, and/or the loss of the reflected light before arriving at the sensing transistor can be greatly reduced, which are advantageous for the detection of the sensing transistor. In addition, the light sensing unit 146 and the pixel driving unit 118 are fabricated on different substrates. As such, the resolution and/or the aperture ratio of the display device will not be influenced. Further, the transistor of the light sensing unit 146 may be aligned with the pixel driving unit 118, which can reduce the influence on the resolution and/or the aperture ratio of the display device 100. In the display device 100, the light sensing unit may be incorporated in the existing substrate structure. As such, it is not needed to reserve an additional space on the surfaces of the display device for the fabrication of the light sensing unit, the manufacturing processes can be simplified, and/or the aesthetic experience or usage convenience can be improved.

Figure 4:
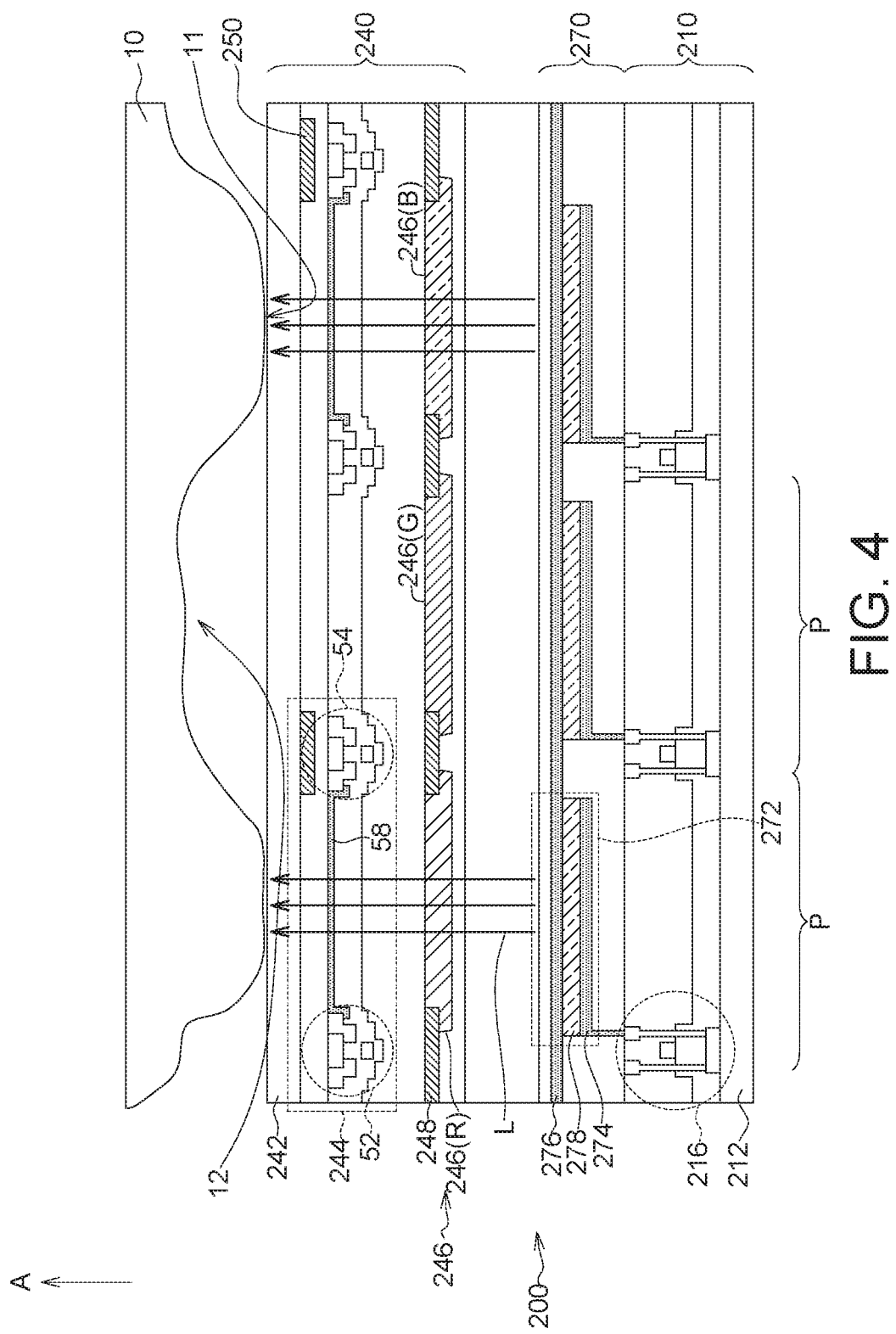
FIG. 4 shows a display device according to one embodiment.

Referring to FIG. 4, a display device 200 according to another embodiment is shown. The display device 200 shown in FIG. 4 is an OLED display device. The first substrate 210 of the display device 200 may comprise the first base 212 and/or the pixel driving unit 216. The second substrate 240 is the substrate at displaying side. The second substrate 240 comprises the second base 242, the light sensing unit 244, and/or the color filter layer 246. For example, these elements are sequentially disposed. The display layer 270 is disposed between the first substrate 210 and the second substrate 240. The display layer 270 comprises an OLED element 272. Corresponding to different sub-pixels P of the display device 200, the display layer 270 may comprise OLED elements 272 of the same color, such as white color. More specifically, the OLED element 272 may comprise a first electrode 274, a second electrode 276, and an organic light emitting layer 278, wherein the light emitting layer 278 may be disposed between the first electrode 274 and the second electrode 276. In some embodiments, the first electrode 274 may be an anode, and the second electrode 276 may be a cathode. In some other embodiments, the first electrode 274 may be a cathode, and the second electrode 276 may be an anode. The disclosure is not limited thereto. The pixel driving unit 216 and the first electrode 274 are electrically connected with each other. In some embodiments, in the fingerprint recognition mode of the display device 200, the light L emitted from the OLED element 272 is reflected by the finger 10 of the user. The light sensing unit 244 receives this reflected light and output a fingerprint sensing signal correspondingly.

In FIG. 4, the display device 200 is illustrated to have a light sensing unit as shown in FIGS. 2A-2C. However, the display device 200 may have a light sensing unit as shown in FIG. 3A, a light sensing unit as shown in FIG. 3B, or any other suitable light sensing unit. The color filter layer 246 comprises color resists of at least two colors and/or a black matrix. The color filter layer 246 may comprise red color resists 246(R), green color resists 246(G), blue color resists 246(B), and/or a black matrix 248. The black matrix 248 defines a plurality of sub-pixels P. The black matrix 248 is disposed between the color resists of different colors to separate the plurality of color resists of different colors. The position of each color resist may correspond to the position of each sub-pixel P. The black matrix 248 may be arranged in a way that it correspondingly shields the pixel driving unit 216 of the first substrate 210, while it is not necessary.

In the condition of using a light sensing unit 244 as shown in FIGS. 2A-2C, in which the light sensing unit 244 comprises the sensing transistor 52 and/or the switching element 54, the second substrate 240 may further comprise the light shielding layer 250 disposed on the second base 242 between the second base 242 and the switching element 54. The position relationship between the light shielding layer 250 and the elements of the light sensing unit 244 (the sensing transistor 52 and/or the switching element 54) is similar to that is described above with respect to FIG. 1A, and further recitation is omitted here. However, it can be understood that the light shielding layer 250 may not be necessary. For example, in the condition of using a light sensing unit as shown in FIG. 3A or FIG. 3B, in which the light sensing unit does not have the switching element 54, the light shielding layer 250 may be omitted.

Figure 5:
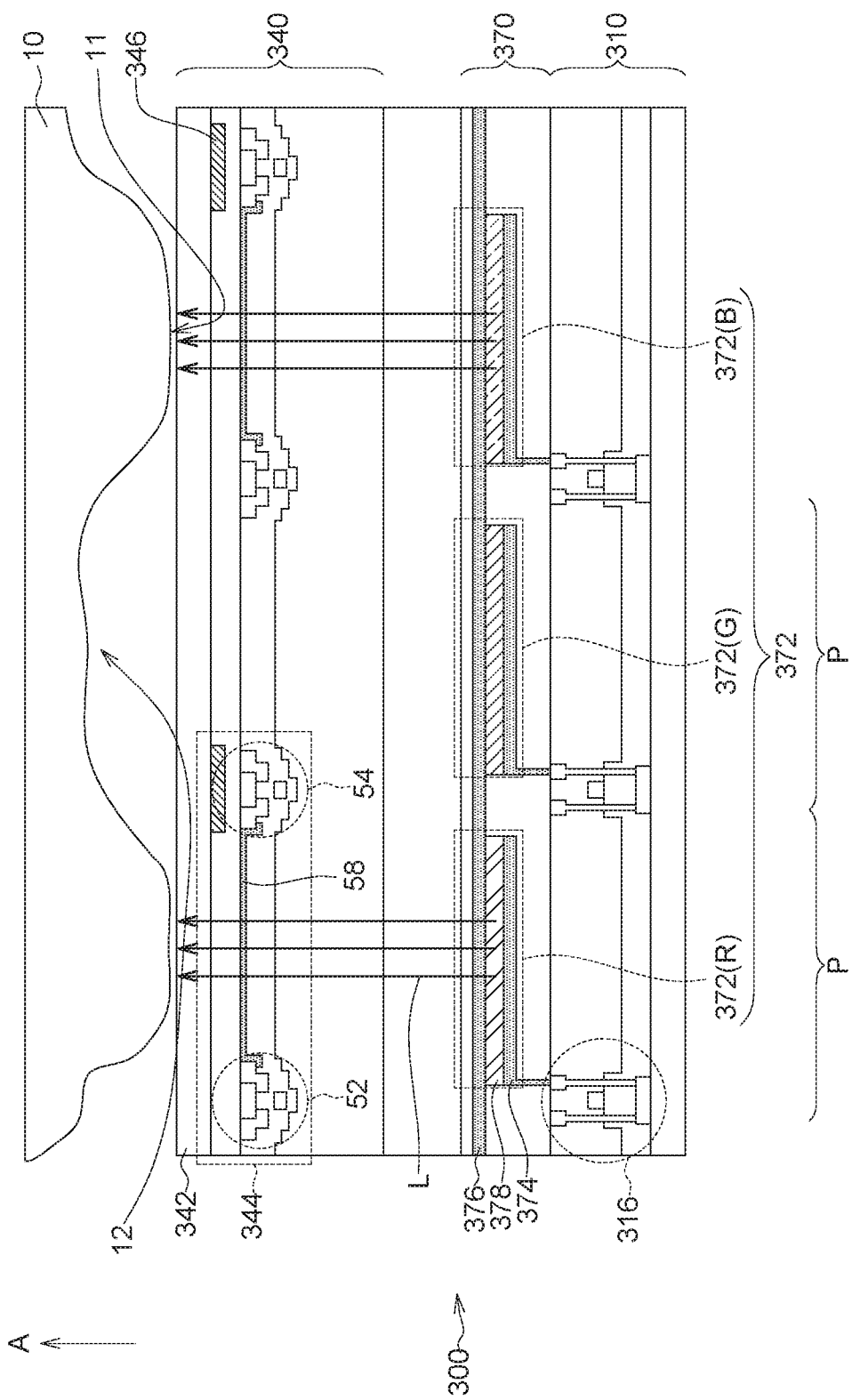
FIG. 5 shows a display device according to one embodiment.

Referring to FIG. 5, a display device 300 according to another embodiment is shown. The display device 300 shown in FIG. 5 is an OLED display device, too. However, different from the display device 200, the display device 300 may comprise OLED elements of at least two colors. For example, the display device 300 is a RGB OLED display device, such as RGB-SBS (side-by-side) display device. The first substrate 310 of the display device 300 may comprise the first base 312 and the pixel driving unit 316 disposed on the first base 312. The second substrate 340 may be the substrate at displaying side, and comprises the second base 342 and the light sensing unit 344 disposed on the second base 342. The display layer 370 is disposed between the first substrate 310 and the second substrate 340. The display layer 370 comprises an OLED element 372. According to some embodiments, in FIG. 5, the display device 300 may comprise OLEDs element 372 of three colors, such as red OLED elements 372(R), green OLED elements 372(G), and/or blue OLED elements 372(B), but the display device 300 is not limited thereto. More specifically, the OLED element 372 may comprise the first electrode 374, the second electrode 376, and the organic light emitting layer 378, wherein the organic light emitting layer 378 is disposed between the first electrode 374 and the second electrode 376. In some embodiments, the first electrode 374 may be an anode, and the second electrode 376 may be a cathode. In some other embodiments, the first electrode 374 may be a cathode, and the second electrode 376 may be an anode. The disclosure is not limited thereto. The pixel driving unit 316 and the first electrode 374 are electrically connected with each other. In some embodiments, in the fingerprint recognition mode of the display device 300, the light L emitted from the OLED element 372 is reflected by the finger 10 of the user, and the light sensing unit 344 receives this reflected light and output a fingerprint sensing signal correspondingly.

In FIG. 5, the display device 300 is illustrated to have a light sensing unit as shown in FIGS. 2A-2C. However, the display device 300 may include a light sensing unit as shown in FIG. 3A, a light sensing unit as shown in FIG. 3B, or any other suitable light sensing unit. In the condition of using a light sensing unit 344 as shown in FIGS. 2A-2C, the second substrate 340 may further comprise the light shielding layer 346 disposed on the second base 342, wherein the light shielding layer 346 is disposed between the second base 342 and the switching element 54. The position relationship between the light shielding layer 346 and the elements of the light sensing unit 344 (the sensing transistor 52 and the switching element 54) is similar to that is described above with respect to FIG. 1A, and further recitation is omitted here. However, it can be understood that the light shielding layer (black matrix) 346 is not necessary. For example, in the condition of using a light sensing unit as shown in FIG. 3A or FIG. 3B, in which the light sensing unit does not have the switching element 54, the light shielding layer (black matrix) 346 may be omitted.

Figure 6:
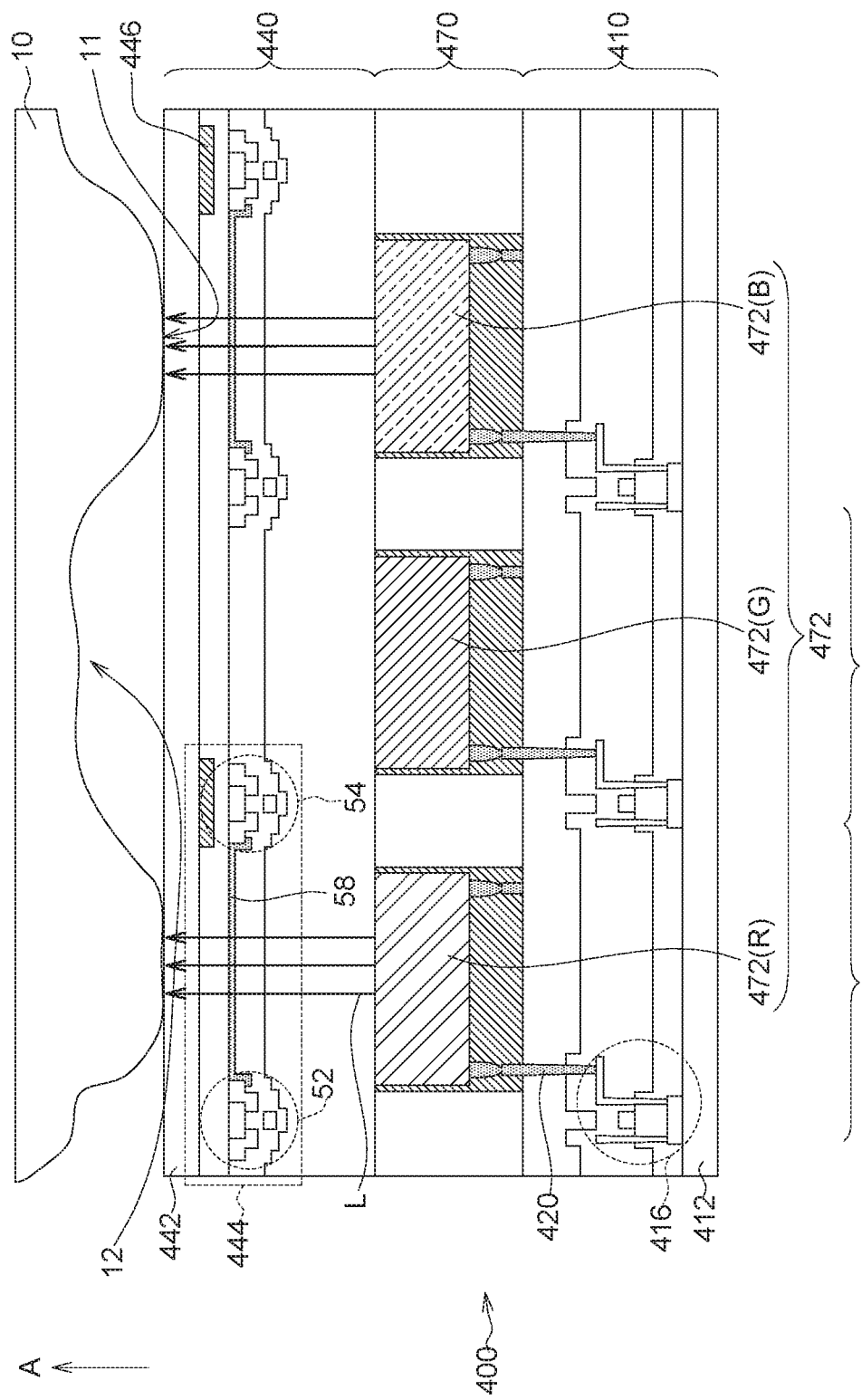
FIG. 6 shows a display device according to one embodiment.

Referring to FIG. 6, a display device 400 according to another embodiment is shown. The display device 400 shown in FIG. 6 may be a micro-LED (µLED) display device. The first substrate 410 of the display device 400 may comprise the first base 412 and the pixel driving unit 416, wherein the pixel driving unit 416 is disposed on the first base 412. The first substrate 410 may further comprise a first electrode 420, wherein the pixel driving unit 416 and the first electrode 420 are electrically connected with each other. The second substrate 440 is the substrate at displaying side, and comprises the second base 442 and the light sensing unit 444 disposed on the second base 442. The display layer 470 is disposed between the first substrate 410 and the second substrate 440, and comprises a µLED element 472. For example, µLED elements 472 of at least two colors may be comprised. The µLED element 472 is electrically connected to the pixel driving unit 416 through the first electrode 420. According to some embodiments, in FIG. 6, the display device 400 may comprise µLED elements 472 of three colors, such as red µLED elements 472(R), green µLED elements 472(G), and/or blue µLED elements 472(B), but the display device 400 is not limited thereto. In some embodiments, in the fingerprint recognition mode of the display device 400, the light L emitted from the µLED element 472 is reflected by the finger 10 of the user, and the light sensing unit 444 receives this reflected light and output a fingerprint sensing signal correspondingly.

In FIG. 6, the display device 400 is illustrated to have a light sensing unit as shown in FIGS. 2A-2C. However, the display device 400 may have a light sensing unit as shown in FIG. 3A, a light sensing unit as shown in FIG. 3B, or any other suitable light sensing unit. In the condition of using a light sensing unit 444 as shown in FIGS. 2A-2C, the second substrate 440 may further comprise the light shielding layer 446. The position relationship between the light shielding layer 446 and the elements of the light sensing unit 444 is similar to that is described above with respect to FIG. 1A, and further recitation is omitted here. However, it can be understood that the light shielding layer (black matrix) 446 is not necessary. For example, in the condition of using a light sensing unit as shown in FIG. 3A or FIG. 3B, in which the light sensing unit does not have the switching element 54, the light shielding layer (black matrix) 446 may be omitted.

Figure 7:
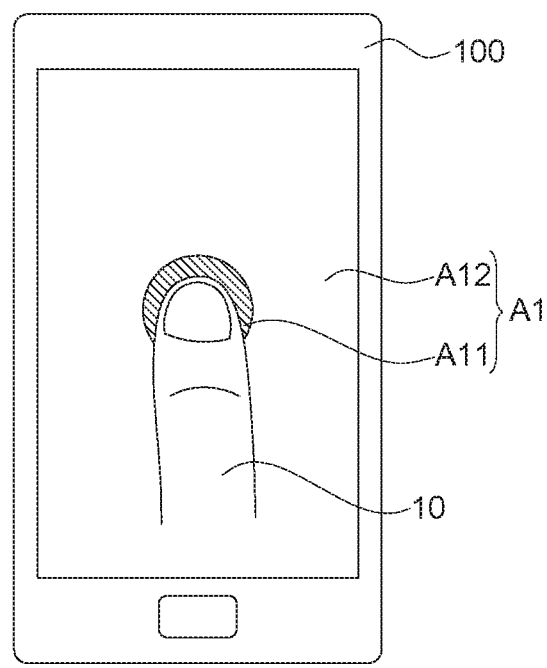
FIG. 7 shows a display device according to one embodiment.

Referring to FIG. 7, the display device 100 comprises a display area A1 and/or a non-display area A2. The display area A1 may comprise a sensing area A11 and/or a non-sensing area A12. The non-sensing area A12 may surround the sensing area A11. All of the display devices described above may be combined with the embodiment shown in FIG. 7. For example, the light sensing unit 146 shown in FIG. 1A may be disposed in the sensing area of the display area of the second substrate 140. In the fingerprint recognition mode of the display device 100, a dark mode may be provided for the sensing area A11, and a bright mode may be provided for the non-sensing area A12. For example, the dark mode is making the area not emitting a light, and the bright mode is making the area emitting a white light. The light source for the bright mode may be the backlight source of the display device, such as the backlight source 105 as shown in FIG. 1A. When the finger of the user touches the sensing area A11, the finger also touches the non-sensing area A12. The light emitted from the bright-mode non-sensing area A12 is transmitted through the finger, and the light sensing unit 146 can receive the light transmitted through the finger and output a fingerprint sensing signal correspondingly. At this time, the sensing area A11 is in the dark mode. The dark mode can reduce a light disturbance caused by the light emitted from the display device 100.

Figure 8:
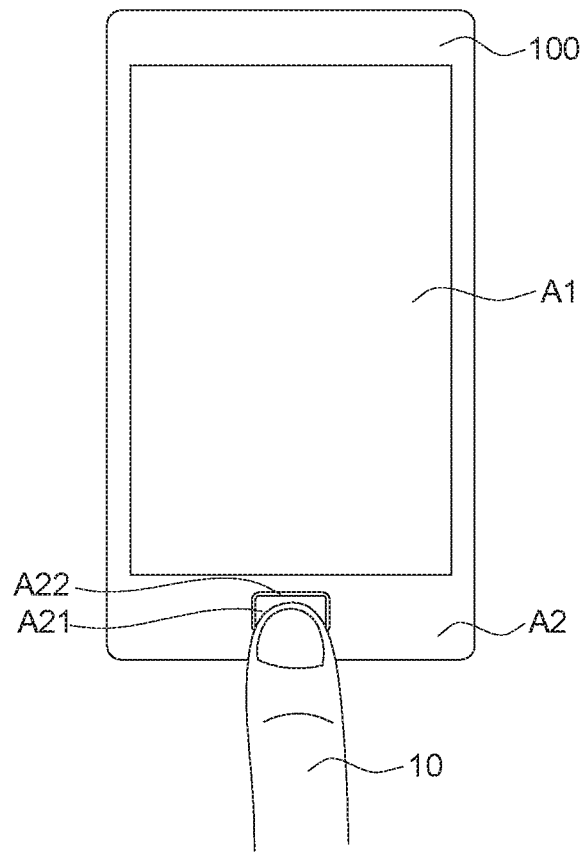
FIG. 8 shows a display device according to one embodiment.

Referring to FIG. 8, the display device 100 comprises a display area A1 and/or a non-display area A2. The non-display area A2 may comprise a sensing area A21 and/or a sensing assisting area A22 surrounding the sensing area A21. For example, the sensing assisting area A22 comprises a light source with a surrounding configuration. The light source may be the backlight source of the display device, such as the backlight source 105 shown in FIG. 1A. All of the display devices described above may be combined with the embodiment shown in FIG. 8. For example, the light sensing unit 146 shown in FIG. 1A may be disposed in the sensing area of the non-display area of the second substrate 140. When the finger of the user touches the sensing area A21, the finger also touches the sensing assisting area A22. The light emitted from the sensing assisting area A22 is transmitted through the finger, and the light sensing unit 146 can receive the light transmitted through the finger and output a fingerprint sensing signal correspondingly.

Referring to FIG. 9, the display device 100 may further comprise an external light source 30. The external light source 30 is disposed adjacent to the second substrate 140. When a display device according to the disclosure is not limited to be used in a portable electronic product, an external light source 30 that emits the light transmitted through the finger 10 of the user may be provided as the light source for fingerprint recognition. The external light source 30 may be an additional light source or an ambient light (such as infrared ray (IR)), but not limited thereto. In this embodiment, in the fingerprint recognition mode of the display device 100, the light sensing unit 146 receives the light L emitted by the external light source 30 and transmitted through the finger 10 of the user, and output a fingerprint sensing signal correspondingly. It can be understood that an external light source may be used in the display devices 100', 200, 300, or 400 according to any other embodiment described above as the light source for fingerprint recognition.

In summary, according to some embodiments, the light sensing unit in the display device may be fabricated on the substrate at displaying side. As such, the light reflected by the finger can have less light loss. According to some embodiments, the light sensing unit and the pixel driving unit are fabricated on different substrates. As such, the display device can maintain a higher resolution. According to some embodiments, it may not be needed to reserve an additional space on the surfaces of the display device for the fabrication of the light sensing unit, and/or a good aesthetic experience can be provided.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A display device, comprising:
   a first substrate comprising a pixel driving unit;
   a second substrate comprising a light sensing unit and a black matrix, wherein the light sensing unit comprises a switching element, the switching element at least partially overlaps the pixel driving unit, and the black matrix is disposed between the switching element and the pixel driving unit; and
   a display layer disposed between the first substrate and the second substrate.

2. The display device according to claim 1, wherein the first substrate comprises:
   a first base;
   the pixel driving unit disposed on the first base; and
   a first electrode disposed on the pixel driving unit;
   wherein the pixel driving unit is electrically connected with the first electrode.

3. The display device according to claim 2, wherein the second substrate further comprises:
   a second base;

wherein the light sensing unit is disposed on the second base, and the light sensing unit comprises a sensing transistor.

4. The display device according to claim 3, wherein the sensing transistor overlaps the pixel driving unit in a normal direction perpendicular to the first base.

5. The display device according to claim 3, wherein
the switching element is disposed on the second base, and the switching element is electrically connected with the sensing transistor.

6. The display device according to claim 5, wherein the second substrate further comprises:
a light shielding layer disposed between the second base and the switching element;
wherein the light shielding layer overlaps the switching element in a normal direction perpendicular to the first base.

7. The display device according to claim 6, wherein the light shielding layer and the sensing transistor are not overlapped in the normal direction.

8. The display device according to claim 6, wherein the light shielding layer overlaps the pixel driving unit in the normal direction.

9. The display device according to claim 3, wherein the sensing transistor comprises amorphous silicon, poly-silicon, or IGZO.

10. The display device according to claim 1, wherein the second substrate further comprises:
a color filter layer disposed between the light sensing unit and the display layer.

11. The display device according to claim 10, wherein the second substrate further comprises—:
a second base;
wherein the black matrix is disposed on the second base—; and
wherein the color filter layer comprises a first color portion and a second color portion, a color of the first color portion is different from a color of the second color portion, and the black matrix is disposed between the first color portion and the second color portion.

12. The display device according to claim 11, wherein the black matrix overlaps the pixel driving unit in a direction perpendicular to the second base.

13. The display device according to claim 1, wherein the second substrate further comprises:
a first conductive line and a third conductive line, which are electrically connected to the light sensing unit, the first conductive line transmits a supply voltage signal to the light sensing unit, and the third conductive line transmits a scan voltage signal to the light sensing unit.

14. The display device according to claim 13, wherein the second substrate further comprises a second conductive line, the first conductive line and the second conductive line extend along a first direction, and the third conductive line extends along a second direction, the first direction different from the second direction.

15. The display device according to claim 1, wherein the second substrate further comprises:
a fourth conductive line, the fourth conductive line connected to a sensing transistor, and the fourth conductive line transmitting a reference voltage signal to the light sensing unit.

16. The display device according to claim 15, wherein the fourth conductive line comprises a transparent electrode layer.

17. The display device according to claim 1, further comprising a backlight source, wherein the first substrate is disposed between the backlight source and the second substrate.

18. The display device according to claim 1, further comprising an external light source, wherein the external light source is disposed adjacent to the second substrate.

19. The display device according to claim 3, wherein the second base comprises a transparent material.

* * * * *